(12) United States Patent
Crotty et al.

(10) Patent No.: US 7,254,157 B1
(45) Date of Patent: Aug. 7, 2007

(54) METHOD AND APPARATUS FOR GENERATING A PHASE LOCKED SPREAD SPECTRUM CLOCK SIGNAL

(75) Inventors: Patrick J. Crotty, San Jose, CA (US); Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 743 days.

(21) Appl. No.: 10/109,130

(22) Filed: Mar. 27, 2002

(51) Int. Cl.
*H04B 1/69* (2006.01)
*H04B 1/707* (2006.01)
*H04B 1/713* (2006.01)

(52) U.S. Cl. ............... 375/132; 375/135; 375/376; 375/373; 331/57

(58) Field of Classification Search ............ 375/130, 375/132, 135, 376, 373; 331/57, 177, 177 R
See application file for complete search history.

(56) References Cited

U.S. PATENT DOCUMENTS

| | | | | |
|---|---|---|---|---|
| 4,217,645 A | * | 8/1980 | Barry et al. .............. 702/63 |
| 4,330,866 A | * | 5/1982 | Malchow .............. 455/161.3 |
| 4,717,935 A | * | 1/1988 | Anacreon .............. 396/161 |
| 4,930,098 A | * | 5/1990 | Allen .............. 708/230 |
| 5,459,437 A | * | 10/1995 | Campbell .............. 331/111 |
| 5,519,706 A | * | 5/1996 | Bantz et al. .............. 455/435.2 |
| 5,821,823 A | * | 10/1998 | Bereza .............. 331/57 |
| 5,999,597 A | * | 12/1999 | Brown .............. 379/93.05 |
| 6,167,527 A | * | 12/2000 | Little et al. .............. 713/500 |
| 6,326,855 B1 | * | 12/2001 | Jelinek et al. .............. 331/57 |
| 6,473,019 B1 | * | 10/2002 | Ruha et al. .............. 341/143 |
| 6,480,072 B1 | * | 11/2002 | Walsh et al. .............. 331/78 |
| 6,529,049 B2 | * | 3/2003 | Erhart et al. .............. 327/94 |
| 6,535,043 B2 | * | 3/2003 | Chen .............. 327/291 |
| 6,580,306 B2 | * | 6/2003 | Hardee .............. 327/328 |
| 2001/0026174 A1 | * | 10/2001 | Delano .............. 327/91 |
| 2002/0063605 A1 | * | 5/2002 | Boerstler .............. 331/57 |

OTHER PUBLICATIONS

National Semiconductor, "ADC0808/ADC0809 8-Bit National Semiconductor uP Compatible A/D converters with 8-channel multiplexer" Nov. 1995, p. 6.*

* cited by examiner

*Primary Examiner*—Phuong Phu
(74) *Attorney, Agent, or Firm*—Jeanette S. Harms; Leroy D. Maunu; Lois D. Cartier

(57) ABSTRACT

A method of and apparatus for generating a spread spectrum clock signal on an integrated circuit are provided. A target frequency generated by a ring oscillator can be modulated by varying a supply voltage to the ring oscillator, thereby changing the target frequency. In one embodiment, the supply voltage is generated by an analog multiplexer that can be digitally controlled. A fixed voltage source can provide an input signal to the analog multiplexer. In one embodiment, the fixed voltage source can be implemented with a unity gain amplifier.

9 Claims, 4 Drawing Sheets

METHOD AND APPARATUS FOR GENERATING A PHASE LOCKED SPREAD SPECTRUM CLOCK SIGNAL

FIELD OF THE INVENTION

The invention relates to generating a clock generator and in particular to a phase-locked spread spectrum clock generator.

BACKGROUND OF THE INVENTION

Many systems and devices rely on clock signals to provide timing control. These clock signals can be provided using crystal oscillators, wherein each crystal oscillator is capable of providing one unique frequency of clock signal. Unfortunately, a crystal oscillator has a high Q value, thereby resulting in a spectral energy of the clock signal being focused in a narrow frequency band. This concentration of energy and its associated harmonics can result in emission of electromagnetic interference in excess of that recommended for those systems and devices.

Modulating the frequency of the clock signal spreads its spectral energy over a wider band of frequencies, thereby reducing the energy of the clock as well as its undesirable harmonics. This modulation is known in the industry as frequency hopping, wherein the frequency varies about a target frequency. (Note that this variation is preferably limited to a relatively narrow band to ensure the overall system timing is preserved.) Reducing the energy (typically measured in decibels with respect to a milliwatt, i.e. dBm) at any one frequency advantageously reduces the noise at that frequency.

Therefore, a need arises for a system and method of modulating the frequency (also referenced herein as providing a spread spectrum clock signal). A need also arises for providing this spread spectrum clock signal in a manner that preserves a uniform delay across temperature.

SUMMARY OF THE INVENTION

A method of generating a spread spectrum clock signal on an integrated circuit is provided. The method can include generating a target frequency using a ring oscillator and varying a supply voltage to the ring oscillator, thereby changing the target frequency. In one embodiment, the supply voltage is generated by an analog multiplexer that can be digitally controlled. Unity gain buffers can provide isolation for the analog multiplexer, i.e. ensuring that the load of other circuits in the integrated circuit as well as of the analog multiplexer do not affect the voltage.

A spread spectrum clock generator is also provided. In accordance with one feature of the invention, the spread spectrum clock generator includes a fixed voltage source, an analog multiplexer for receiving an output of the fixed voltage source, and a ring oscillator having a voltage supply provided by the analog multiplexer. In one embodiment, the analog multiplexer includes a voltage divider provided in operative relation to a plurality of transistors, wherein turning on a predetermined set of the transistors provides a predetermined output voltage at the output of the analog multiplexer. The plurality of transistors can have a thick gate oxide to ensure that the desired predetermined output voltage is output, irrespective of the threshold drop associated with the conducting transistor(s). A buffer can be coupled between the analog multiplexer and the ring oscillator, thereby providing a level of isolation between these elements. In one embodiment, the fixed voltage source and the buffer can be implemented with unity gain amplifiers.

DETAILED DESCRIPTION OF THE DRAWINGS

Figure 1:
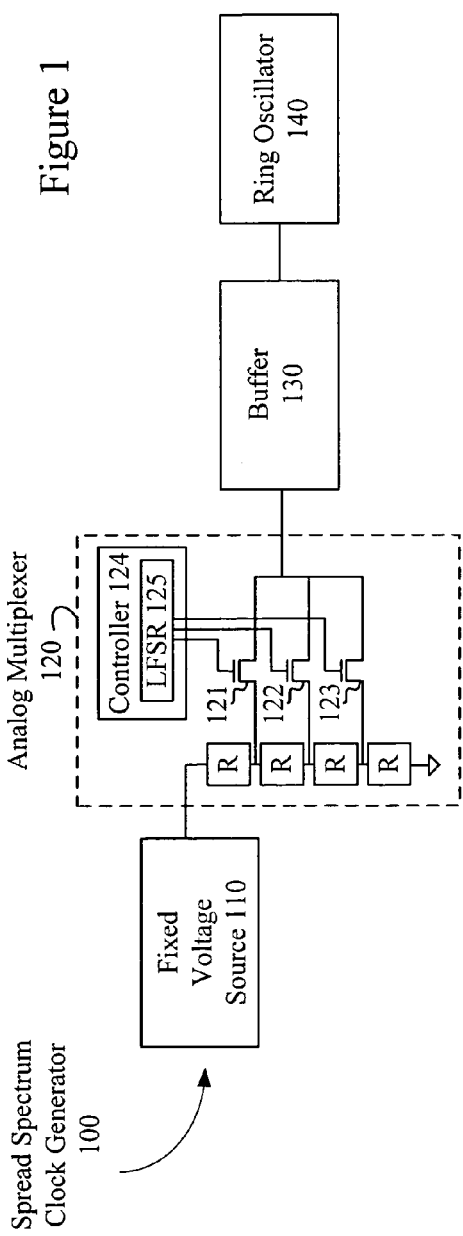
FIG. 1 illustrates a simplified diagram of one spread spectrum clock signal generator.

FIG. 1 illustrates one embodiment of a simplified spread spectrum clock signal generator 100. In this embodiment, a fixed voltage source 110 provides an output signal to an analog multiplexer 120. The output of analog multiplexer 120 is coupled to a ring oscillator 140 via a buffer 130. Specifically, and described in further detail in FIG. 5, the output of analog multiplexer 120 provides the supply voltage to ring oscillator 140.

The supply voltage to ring oscillator 140 can vary the frequency of ring oscillator 140. Specifically, the higher the supply voltage, the faster the oscillation of ring oscillator 140. In a similar manner, the lower the supply voltage, the slower the oscillation of ring oscillator 140. By receiving a predetermined range of supply voltages, ring oscillator 140 can provide the desired frequency hopping.

In one embodiment, analog multiplexer 120 includes a voltage divider comprising a plurality of resistors R. Advantageously, a plurality of transistors 121-123, coupled to their respective nodes of the voltage divider, can be selectively turned on by a controller 124 to output the desired analog output signal. In this manner, the output voltage of analog multiplexer 120 varies within a predetermined range defined by the resistors R in the voltage divider. Note that the last resistor in the resistor chain is shown as being connected to ground. Of course, this resistor may be connected to another voltage source in order to give a different range of voltages in the voltage divider. Analog multiplexer 120 provides an analog transmission because it conserves the analog voltage generated by the voltage divider.

In accordance with one feature of the invention, controller 124 can programmably determine the time that each of transistors 121-123 is turned on, thereby varying the voltage provided by analog multiplexer 120. Preferably, these times are selected to spread a frequency, i.e. to change to a new frequency, stay at that new frequency for a predetermined period of time, and then move to another frequency. The frequencies are chosen about a desired frequency, wherein the changing between the frequencies provides the desired frequency hopping.

Thus, controller 124, which determines the on/off time periods of transistors 121-123, in effect controls the frequency hopping of ring oscillator 140. In one embodiment, controller 124 can selectively turn on transistors 121-123 by using a linear feedback shift register (LFSR) 125 implementing an algorithm. Note that the LFSR 125 can provide a pseudo-random pattern, which advantageously looks like noise in a typical system. In another embodiment, controller 124 can selectively turn on the transistors by following a non-random pattern, e.g. a serial pattern.

In accordance with one feature of the invention, fixed voltage source 110 provides an output signal to analog multiplexer 120, wherein fixed voltage source 110 serves as a voltage regulator in spread spectrum clock generator 100. In one embodiment, fixed voltage source 110 can be implemented with a unity gain amplifier. A unity gain amplifier (a type of non-inverting operational amplifier) is very sensitive to RF and, as the name implies, provides an output voltage equal to the input voltage. Thus, any temperature increase in the system that includes spread spectrum clock generator 100 can be advantageously reflected in a commensurate increase in the output voltage of fixed voltage source 110. A unity gain amplifier also places a minimum load on the connected circuit while ensuring isolation between circuits. Thus, in one embodiment of spread spectrum clock generator 100, buffer 130 (provided between analog multiplexer 120 and ring oscillator 140) can also be implemented with a unity gain amplifier. Note that in other embodiments fixed voltage source 110 and/or buffer 130 can also be implemented with a digital to analog (D/A) device or a non-unity gain amplifier.

Figure 2:
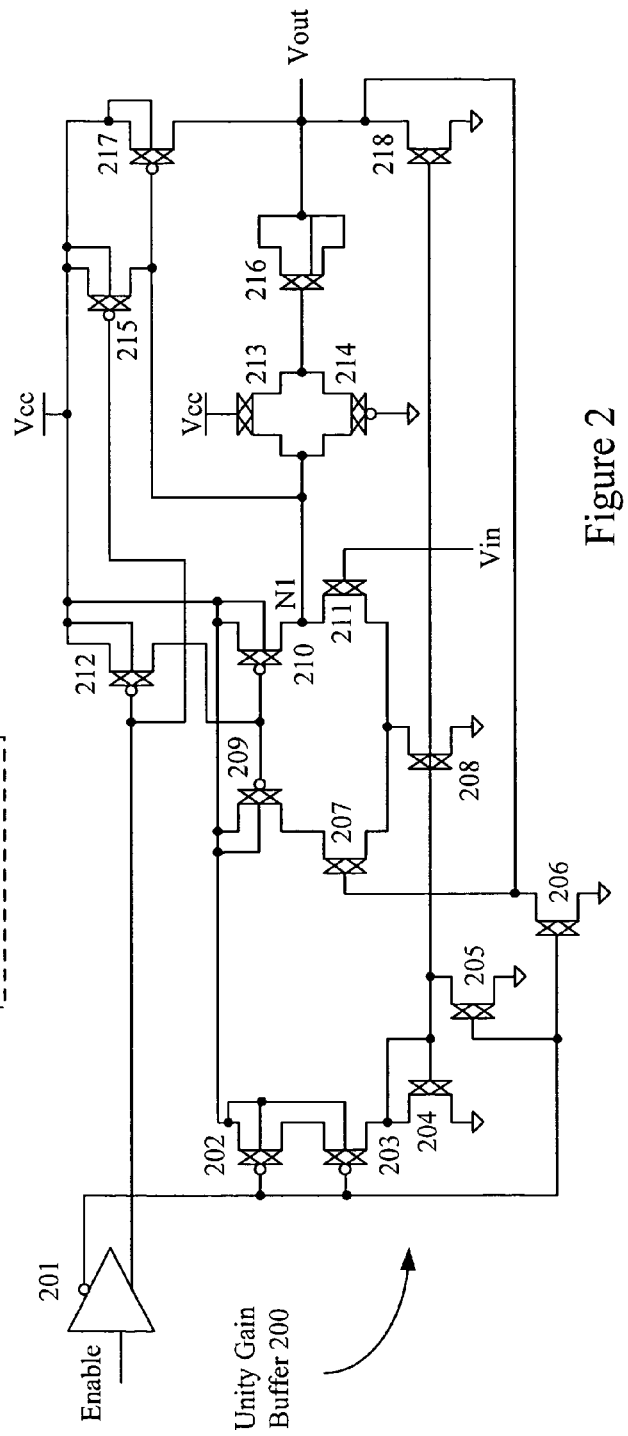
FIG. 2 illustrates one embodiment of a unity gain amplifier that can be used in the spread spectrum clock signal generator.

FIG. 2 illustrates one embodiment of a unity gain amplifier 200. A buffer 201, which receives an Enable signal, can selectively cut off the current, thereby disabling the circuit (explained below). Transistors 202 and 203 are long channel devices that limit the current into transistor 204. Transistor 204 controls current through transistors 208 and 218 (which serve as constant current sources when enabled). Transistor 208 acts as current source for the differential pair comprising transistors 207 and 211. In this configuration, if the gate of transistor 207 has a higher voltage than the gate of transistor 211, then more of the current from transistor 208 will pass through transistor 207. The increased current through transistor 207 effectively raises the voltage at node N1. This increased node voltage will slightly turn off transistor 217, thereby lowering the analog voltage Vout. In contrast, if the voltage on the gate of transistor 207 is lower than the voltage on the gate of transistor 211, then more of the current provided by transistor 208 will be going through transistor 211. In this manner, the voltage on node N1 will decrease, thereby turning on transistor 217 more strongly and thus raising the voltage Vout. Thus, as the voltage Vin on the gate of transistor 211 varies, the voltage Vout follows. Note that transistor 216 serves as a compensation capacitor for stability (i.e. can be made smaller for a faster buffer, but if made too small, then oscillation can result) whereas transistors 213 and 214 serve as a nulling resistor, thereby providing RC compensation on the feedback path across transistor 217. In this embodiment, a low Enable signal causes buffer 201 to turn on transistors 205 (which disables the current source provided by transistor 208) and 206 (which completely turns off transistor 207) and to turn off transistors 212 (which disables a current mirror comprising transistors 209 and 210) and 215.

Figure 3:
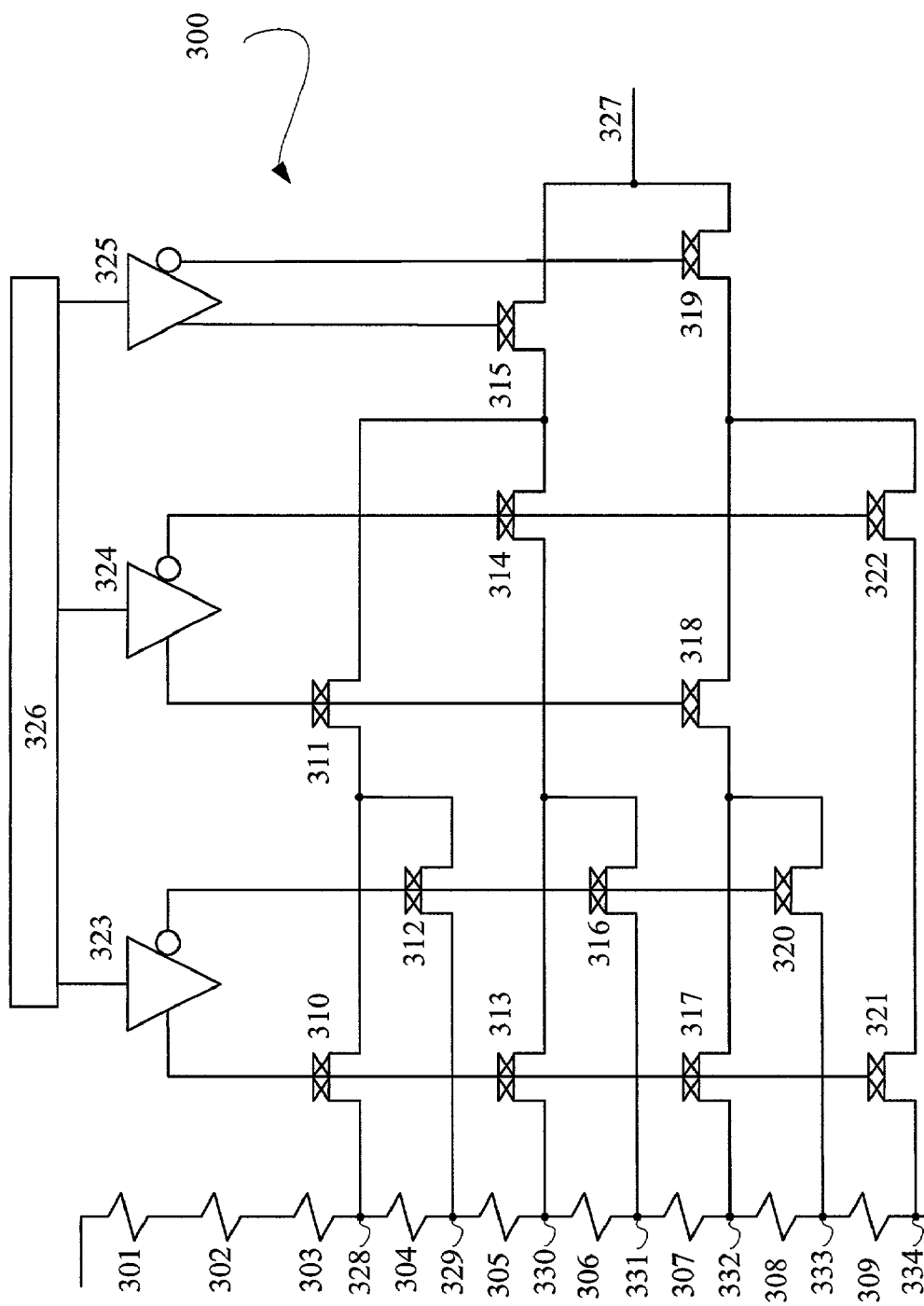
FIG. 3 illustrates one embodiment of an analog multiplexer that can be used in the spread spectrum clock signal generator.

FIG. 3 illustrates one embodiment of an analog multiplexer 300 that can be used in a spread spectrum clock generator. In analog multiplexer 300, a plurality of serially-connected resistors 301-309 can be provided. In one embodiment, each of these resistors can provide an identical resistance, e.g. 1 kOhm (relying on the fact that identical structures have identical electrical properties). Advantageously, with identical resistances, the resistance of these resistors will change with voltage, temperature, and process in a similar manner. Therefore, tracking of these changes is not necessary. Note that other embodiments of the invention can include more or fewer resistors as well as provide different resistance values. Note that providing resistors of equal resistance can advantageously simplify simulation, but is not necessary to the invention. Therefore, resistors 301-309 could have different resistances. In one embodiment, resistors 301-309 are formed using the diffusion layer.

In analog multiplexer 300, nodes between certain of resistors 301-309 provide the potential range of voltages that can be output on line 327. Drivers 323-325, which receive their respective input signals from a controller 326 and output both inverted and non-inverted versions of their input signals, control the gate voltages provided to a plurality of transistors 310-322. In one embodiment in which the spread spectrum clock generator is implemented in a programmable logic device (PLD), controller 326 includes a plurality of memory cells, wherein the values stored in the memory cells are provided by either the pseudo-random or non-random methods described above. Note that controller 326 can be provided on- or off-chip using one of programmable resources and dedicated resources.

Because controller 326 provides three input signals, analog multiplexer 300 can be an 8-to-1 multiplexer. In other embodiments, analog multiplexer 300 can include more or fewer levels of multiplexing. Logically, for tighter frequency control than that provided by analog multiplexer 300, the analog multiplexer can include additional resistors (thereby allowing for additional nodes in the voltage divider) with smaller resistances (thereby providing smaller gradations in voltages on line 327), additional transistors connected to those nodes, and additional drivers to control those transistors.

In analog multiplexer 300, transistors 310-322 are n-type transistors. In other multiplexers, transistors 310-322 can be implemented with either p-type transistors or a combination of n- and p-type transistors (i.e. a CMOS process). In one embodiment (shown), transistors 310-322 can be made using a thick gate oxide, e.g. approximately 70 Å for a 0.35 micron technology, and have a width/length ratio of 5/0.44. This thick gate oxide is used so that high voltages can be provided to the gates of transistors 310-322. For example, in one implementation, a voltage of 1.5V can be provided to the voltage divider at resistor 301 and a voltage of 3.3V can be provided to the gates of transistors 310-322. A higher gate voltage ensures that the analog voltage provided by one of nodes 328-334 can be transferred to line 327, irrespective of the threshold drops through the conducting transistors providing the path between that node and line 327.

Specifically, transistors 310-322 couple line 327 to one of nodes 328-334. For example, if drivers 323-325 respectively receive input signals 111 from controller 326, then transistors 310, 311, 313, 315, 317, 318, and 321 are conducting and all other transistors are non-conducting. Of the conducting transistors, only transistors 310, 311, and 315 form a path from one of nodes 328-334 to line 327. In this case, node 328 is coupled to line 327. Table 1 illustrates the respective input values of buffers 323-325, the node coupled to line 327, and the conducting transistors forming the path from that node to line 327.

TABLE 1

| Driver 323 | Driver 324 | Driver 325 | Node | Conducting Transistors |
| --- | --- | --- | --- | --- |
| 1 | 1 | 1 | 328 | 310/311/315 |
| 0 | 1 | 1 | 329 | 312/311/315 |
| 1 | 0 | 1 | 330 | 313/314/315 |

TABLE 1-continued

| Driver 323 | Driver 324 | Driver 325 | Node | Conducting Transistors |
|---|---|---|---|---|
| 0 | 0 | 1 | 331 | 316/314/315 |
| 1 | 1 | 0 | 332 | 317/318/319 |
| 0 | 1 | 0 | 333 | 320/318/319 |
| 1 | 0 | 0 | 334 | 321/322/319 |

In one embodiment, the mid-point of the voltage divider, i.e. node 331, can be coupled first to line 327, thereby providing the middle point of the frequency range.

Figure 4:
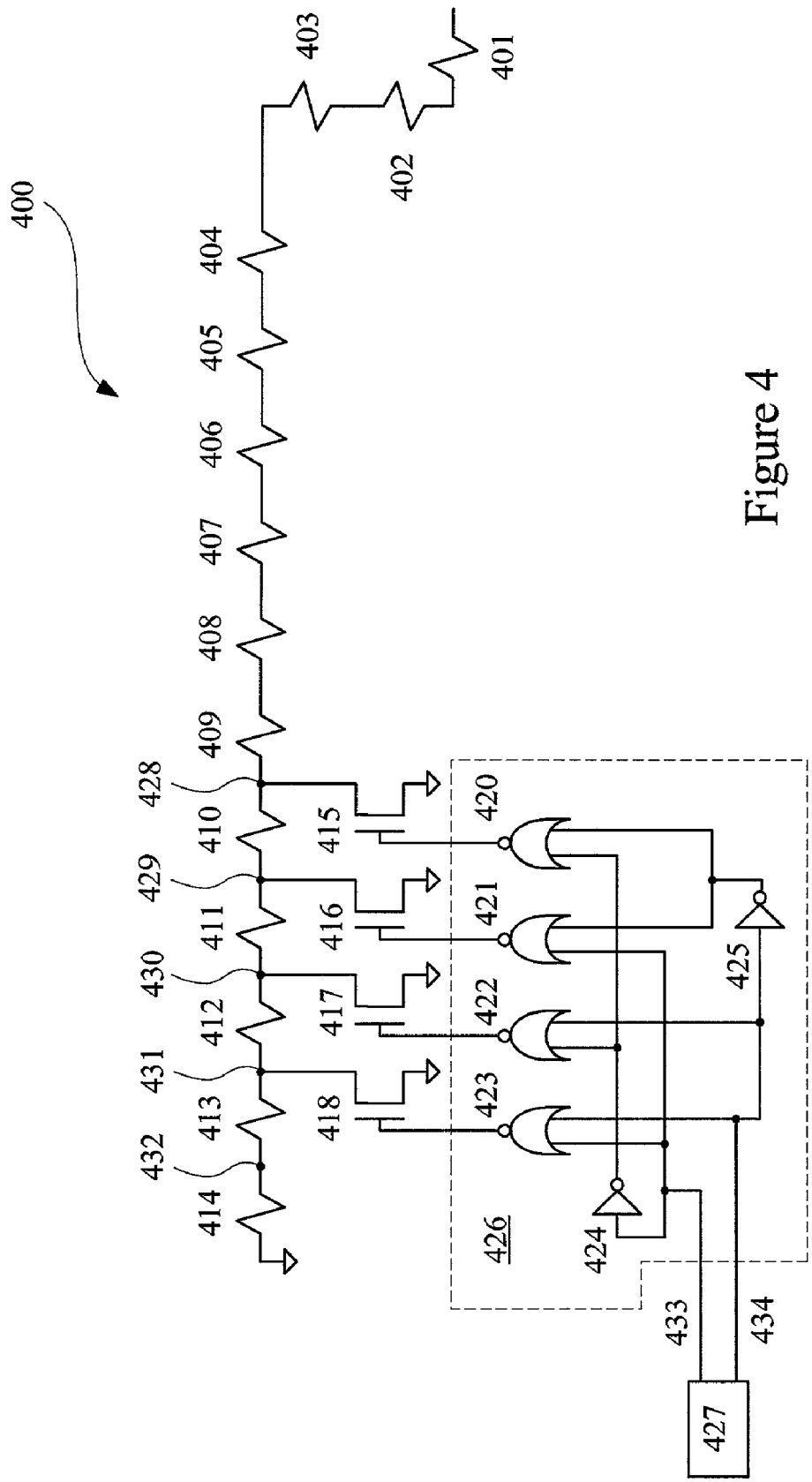
FIG. 4 illustrates one embodiment of a range shifter that can be coupled to the analog multiplexer.

FIG. 4 illustrates a range shifter 400 than can be connected to line 335 (FIG. 3) to provide a coarse adjustment to the frequency (compared to resistors 301-309 that provide a fine adjustment). Specifically, range shifter 400 includes a plurality of serially-connected resistors 401-414, wherein resistor 401 can be connected to line 335. In one embodiment, each of resistors 401-414 has an identical resistance, e.g. 1 kOhm. In one embodiment, each of resistors 401-414 has a resistance substantially equal to resistors 301-309. In other embodiments, resistors 401-414 can have different resistances. Note that range shifter 400 can include any number of resistors, wherein resistors 401-414 are provided merely for illustration purposes.

Nodes 428-431 can be selectively coupled to ground by a controller 426. Specifically, a plurality of transistors 415-418 can be connected between ground and nodes 428-431, respectively. Thus, for example, if transistor 415 is conducting, then the resistances provided by resistors 410-414 can be ignored. Adding the resistance of one or more of resistors 410-414 effectively shifts the value of the voltage on line 327. Note that in this embodiment, if range shifter 400 is connected to analog multiplexer 300, then resistors 401-409 become part of the voltage divider comprised of resistors 301-309 whereas resistors 410-414 can programmably become part of that voltage divider using decoder 426. This range shifter 400 can be advantageously used to programmably adjust for variations in the manufacturing process. In this manner, if the mid-point of the desired frequency is not provided by node 331 in analog multiplexer 300, for example, then range shifter 400 can be used to change the voltage provided by that node. This software solution is more efficient and less expensive than other options to achieve the same result (e.g. revising a mask, laser trimming, using non-volatile memory, etc.).

In this embodiment, decoder 426 includes four NOR gates 420-423, which receive two input signals provided by a controller 427. Specifically, NOR gate 420 receives an inverted signal of line 433 (via inverter 424) and an inverted signal of line 434 (via inverter 425). NOR gate 421 receives the signal of line 433 and an inverted signal of line 434 (via inverter 425). NOR gate 422 receives an inverted signal of line 433 (via inverter 424) and the signal of line 434. Finally, NOR gate 423 receives the signals of lines 433 and 434.

Note that controller 427 can be implemented using two memory cells provided in a PLD. Alternatively, controller 427 can be controlled by any digital control means, such as an on-chip resource, either implemented in programmable or dedicated resources, or an asynchronous off-chip source.

Ring oscillator 140 (FIG. 1) typically includes a plurality of serially-connected inverters, wherein each inverter receives a supply voltage provided by analog multiplexer 120. In one embodiment, ring oscillator 140 can include a delay lock loop, such as that described in U.S. Pat. No. 6,289,068, incorporated by reference herein. However, any ring oscillator using a supply voltage provided by analog multiplexer 120 can advantageously generate a spread spectrum clock signal.

Figure 5:
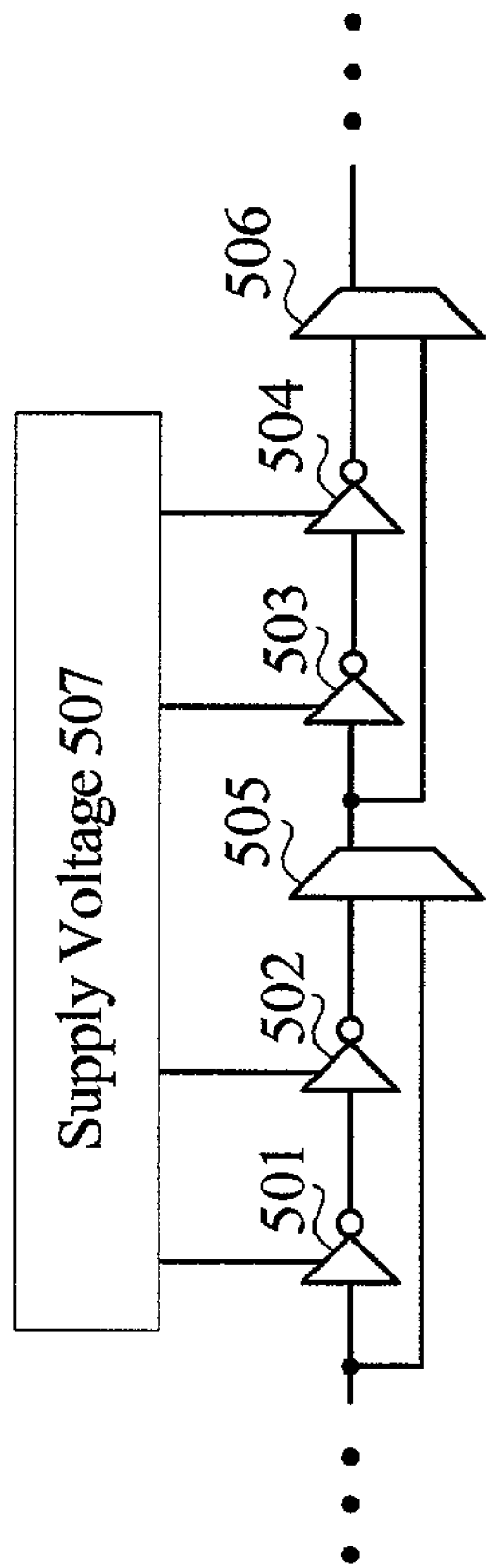
FIG. 5 illustrates one embodiment of a ring oscillator that can be used in the spread spectrum clock signal generator.

FIG. 5 illustrates a portion of a ring oscillator including a plurality of serially-connected inverters 501-504. As noted in FIG. 5, a supply voltage 507 is provided to inverters 501-504, wherein supply voltage 507 can be generated by the analog multiplexer of the invention. In this embodiment, the delay associated with the ring oscillator can be programmably changed by the use of multiplexers. For example, a multiplexer 505 can be placed after inverters 501 and 502 whereas a multiplexer 506 can be placed after inverters 503 and 504. In this embodiment, the delay associated with inverters 501/502 and/or inverters 503/504 can be eliminated by using multiplexers 505 and 506, respectively. The delay associated with the inverters not bypassed by the multiplexers provides the target frequency. The frequency hopping about this target frequency can be provided by the variation in supply voltage 507 as provided by the analog multiplexer (130/300). This frequency hopping advantageously spreads the noise from the clock signal associated with the target frequency.

The various embodiments of the structures and methods of the invention that are described above are illustrative only of the principles of this invention and are not intended to limit the scope of the invention to the particular embodiments described. For example, one implementation of analog multiplexer 300 can include identical sizes, e.g. width/length of 5/0.44, for transistors 310-322. In this implementation, drivers 323-325 can include p-type transistors having a width/length of 2/0.44 and n-type transistors having a width/length of 1/0.44. In one implementation of unity gain buffer 200, transistor pairs 209/210, 207/211, and 204/208 are laid out for analog matching, i.e. all segments identical in size and current direction. Sizes for the transistors of unity gain buffer 200 can vary, but one embodiment is provided for illustration purposes only. Specifically, transistor 202-218 have the following width/length sizes: 202 and 203:0.7/1, 204:6/2, 205 and 206:0.55/2, 207 and 211/ 20/2, 208:30/2, 209 and 210:15/2, 212:1/2, 213:1.1/2, 214: 2.15/1, 215:1/2, 216:70/1.5, 217:35/2, and 218:1/2. In this implementation, buffer 201 can include p-type transistors having a width/length size of 2/0.44 and n-type transistors having a width/length of 1/0.44.

In view of this disclosure those skilled in the art can implement a spread spectrum clock generator on any integrated circuit. In one embodiment, the spread spectrum clock generator can be implemented on a programmable logic device (PLD), e.g. a field programmable gate array (FPGA) or a complex programmable logic device (CPLD). These PLDs are "off the shelf" logic chips that a customer, rather than a chip manufacturer, can program to perform specific functions. For example, an FPGA can include configurable logic blocks, interconnect, and input/output blocks, all of which are programmably controlled by values stored in static memory cells. These values are loaded into the memory cells during configuration and can be reloaded to change the functions of the programmable elements. Thus, for example, any element shown in FIG. 1 could be implemented by an FPGA. A CPLD can include function blocks interconnected by an interconnect array. In one device, the function blocks can include a PLA array that generates control terms, clock terms, and logic cells. The PLA can include a fully programmable AND array followed by a fully programmable OR array. These arrays can be programmed using EEPROM memory cells. The invention is equally applicable to a CPLD. Other devices can also implement the present invention. In fact, any integrated circuit can implement the spread spectrum clock generator of the invention. Thus, the invention is limited only by the following claims.

The invention claimed is:

1. A spread spectrum clock generator, comprising:
   a fixed voltage source for providing a first voltage;
   an analog multiplexer including a chain of serially-connected resistors of a voltage divider, a plurality of transistors, and a controller adapted to selectively turn on and off each of the transistors for each of a plurality of time periods, wherein the chain of serially-connected resistors of the voltage divider is coupled between the first voltage from the fixed voltage source and a second voltage, and each of the transistors selectively couples a respective node that is between two of the serially-connected resistors in the chain of the voltage divider, to an output of the analog multiplexer;
   a ring oscillator including a plurality of inverters that have a voltage supply coupled to the output of the analog multiplexer;
   a buffer that couples the output of the analog multiplexer to the voltage supply of the inverters of the ring oscillator, wherein the buffer comprises a unity gain amplifier; and
   a range shifter that includes another chain of serially-connected resistors of the voltage divider, another plurality of transistors, and another controller adapted to selectively turn on each of the another plurality of transistors, wherein the another chain of serially-connected resistors is coupled between the second voltage of the analog multiplexer and ground, and each of the another plurality of transistors selectively couples to the ground a respective node, which is between two of the serially-connected resisters in the another chain of the voltage divider.

2. The spread spectrum clock generator of claim 1, wherein turning on a predetermined set of the transistors by the controller of the analog multiplexer provides a predetermined output voltage at the output of the analog multiplexer.

3. The spread spectrum clock generator of claim 2, wherein the plurality of transistors have a thick gate oxide.

4. The spread spectrum clock generator of claim 1, wherein the controller of the analog multiplexer uses a pseudo-random pattern from a linear feedback shift register to selectively turn on and off each of the plurality of transistors of the analog multiplexer for each of the time periods.

5. The spread spectrum clock generator of claim 4, wherein the ring oscillator further includes a plurality of multiplexers for selectively bypassing a delay of a respective subset of the inverters of the ring oscillator, a delay of the inverters that are not bypassed providing a target frequency of the ring oscillator.

6. The spread spectrum clock generator of claim 5, wherein the first voltage is a fixed voltage of 1.5 volts.

7. An integrated circuit, comprising:
   a plurality of integrated circuit elements; and
   a spread spectrum clock generator generating a clock signal for controlling the Plurality of integrated circuit elements, the spread spectrum clock generator comprising:
      a fixed voltage source for providing a first voltage;
      an analog multiplexer including a chain of serially-connected resistors of a voltage divider, a plurality of transistors, and a controller adapted to selectively turn on and off each of the transistors for each of a Plurality of time periods, wherein the chain of serially-connected resistors of the voltage divider is coupled between the first voltage from the fixed voltage source and a second voltage, and each of the transistors selectively couples a respective node, which is between two of the serially-connected resisters in the chain of the voltage divider, to an output of the analog multiplexer; and
      a ring oscillator including a plurality of inverters that have a voltage supply coupled to the output of the analog multiplexer,
   wherein the controller of the analog multiplexer of the spread spectrum clock generator uses a pseudo-random pattern from a linear feedback shift register to selectively turn on and off each of the transistors of the analog multiplexer for each of the time periods, and
   wherein the spread spectrum clock generator further comprises a range shifter that includes another chain of serially-connected resistors of the voltage divider, a plurality of transistors, and a controller adapted to selectively turn on each of the transistors, wherein the another chain of serially-connected resistors is coupled between the second voltage of the analog multiplexer and ground, and each of the transistors selectively couples to the ground a respective node, which is between two of the serially-connected resisters in the another chain of the voltage divider.

8. The integrated circuit of claim 7, wherein the ring oscillator of the spread spectrum clock generator further includes a plurality of multiplexers for selectively bypassing a delay of a respective subset of the inverters of the ring oscillator, a delay of the inverters that are not bypassed providing a target frequency of the clock signal.

9. The integrated circuit of claim 8, wherein the integrated circuit comprises a programmable logic device (PLD).

* * * * *